United States Patent [19]

Lay

[11] Patent Number: 5,192,739

[45] Date of Patent: Mar. 9, 1993

[54] METHOD OF FORMING A TAPE OF THE HIGH TEMPERATURE OXIDE SUPERCONDUCTORS

[75] Inventor: Kenneth W. Lay, Schenectady, N.Y.

[73] Assignee: General Electric Company, Schenectady, N.Y.

[21] Appl. No.: 723,032

[22] Filed: Jun. 28, 1991

[51] Int. Cl.$^5$ ............................................. H01L 39/12
[52] U.S. Cl. ........................................ 505/1; 156/89; 264/61; 505/739; 505/740
[58] Field of Search .................. 156/89; 264/61, 63; 505/1, 725, 739, 740, 741, 813

[56] References Cited

U.S. PATENT DOCUMENTS 4,906,609  3/1990  Yamauchi et al. ..................... 505/1
5,030,615  7/1991  Awazu et al. ........................... 505/1

OTHER PUBLICATIONS

"Potential Methods for the Fabrication of High-Tc Superconductors for Wires and Cables", Kyoji Tachikawa and Kazumasa Togano, Proceedings of the IEEE, vol. 77, No. 8, Aug. 1989.

"Development of High-Tc Superconductor Wire with High Critical Current Density", Toshimi Matsumoto, Katsuzo Aihara, Masahiro Seido, Hitachi Review, vol. 39 (1990), No. 1.

Primary Examiner—Jan H. Silbaugh
Assistant Examiner—Christopher A. Fiorilla
Attorney, Agent, or Firm—James E. McGinness; James Magee, Jr.

[57] ABSTRACT

A method of forming a superconducting tape having a silver sheath and a polycrystalline oxide superconductor core includes, forming at least one silver foil to have a receiving surface for supporting a deposit, and at least one enclosing surface that can cover the deposit and overlap another portion of the foil so that the surfaces form the sheath. The foil has a first thickness at the receiving surface and a second thickness at the enclosing surface. A precursor deposit of the superconductor is formed on the receiving surface. The enclosing surface is wrapped to cover the deposit and overlap another portion of the foil to form the sheath. The first and second thicknesses being preselected so that the thickness of the overlapping foils is equivalent to the thickness of foil oppositely facing the overlapping foils. The overlapping foils are sealed, and annealed to reaction-sinter the sealed deposit and form the tape.

3 Claims, 2 Drawing Sheets

METHOD OF FORMING A TAPE OF THE HIGH TEMPERATURE OXIDE SUPERCONDUCTORS

This invention was made with Government support under Contract No. N00014-88-C-0681 awarded by the Department of the Navy. The Government has certain rights in the invention.

BACKGROUND OF THE INVENTION

This invention relates to a method of forming superconducting tape of a high temperature oxide superconductor, and in particular to a tape having a silver cladding or sheath.

A new superconductor comprised of oxides of lanthanum, barium, and copper, and having a critical temperature of 30 Kelvin, K, was discovered at the Zurich laboratory of International Business Machines Corporation, J. G. Bednorz et al., "Possible High-$T_c$ Superconductivity in the Ba-La-Cu-O System," Z. Phys. V. 64, 189 1987. The discovery of the lanthanum-barium-copper-oxide system led to the discovery of a series of superconducting systems having a high critical temperature above 30 K. Exemplary of the newly discovered systems are, lanthanum-strontium-copper-oxide , yttrium-barium-copper-oxide, bismuth-strontium-calcium-copper-oxide, and thalium-barium-calcium-copper-oxide. The superconductors in the above systems, having a critical temperature above 30 K, are herein referred to as high temperature oxide superconductors or oxide superconductors. Additional information about the oxide superconductors and methods of forming powders or films thereof can be found, for example, in the following disclosures incorporated herein by reference, "Chemical Engineering and the Development of Hot Superconductors," R. Kumar, Chemical Engineering Progress, pp.17–27, April 1990, and "Chemistry of High-Temperature Superconductors," A. W. Sleight, Science, Vol. 242, pp.1519–1527, Dec. 1988.

The discovery of the oxide superconductors enables the development of superconducting equipment operated under liquid nitrogen cooling, about 77 K, instead of liquid helium cooling, about 4.2 K. Among the applications for such oxide superconductors are power transmission lines, rotating machinery, superconducting magnets, e.g. for, fusion generators, particle accelerators, levitated vehicles, magnetic separation, energy storage, and magnetic resonance imaging. These devices require the development of wire or tape of the oxide superconductors.

Owing to the brittleness and reactivity of oxide superconductors, it is advantageous to form metal-ceramic composites of metal-clad oxide superconductor wires, tapes, and multifilaments, so that the metal claddings malleability compensates for the ceramics brittleness. Furthermore, the metal provides a good means of thermal dissipation, stabilizing the superconductor environment. The stabilizing effect is of fundamental importance for Type II superconductors, in which undesirably large local rises in temperature can develop through flux jumping in the mixed state. Flux jumping is a sudden, localized flux motion resulting in a local rise in temperature. Unfortunately, the Type II oxide superconductors, in particular, bismuth-lead-strontium-calcium-copper-oxide, react with nearly every metal with which they come into contact.

Silver has been found to be compatible with and non-poisoning to the superconducting systems yttrium-barium-copper-oxide, thallium-barium-calcium-copper-oxide, and bismuth-strontium-calcium-copper-oxide. It is also known that lead can be added to the bismuth system in order to stabilize the phase having a critical temperature of 110 K, comprised of bismuth, strontium, calcium, and copper oxides in the ratio of about 2:2:2:3, respectively. Such superconductor compositions and phases are sometimes herein shown by a formula, for example, $Bi_2Sr_2Ca_2Cu_3O_{10+y}$. The cation ratios given in such formulas usually indicate the ideal structure, and the exact oxygen content per molecular unit is nominal so that y varies within about a fraction of one. In addition, there may be substitution of cations on other sites, cation vacancies, or oxygen interstitials present so that the actual superconducting phase is not exactly that given by the ideal formula.

One of the most promising methods of forming oxide superconductors into long wires or tapes is the powder in tube drawing-rolling process, for example, see "Development of High-$T_c$ Superconducting Wire with High Critical Current Density", T. Matsumoto, K. Aihara, M. Seido, Hitachi Review, Vol. 39, (1990), No. 1, pp. 55–62, incorporated herein by reference. Briefly described, in this method superconducting powder was put into a 300 millimeter long silver tube with a 6 millimeter diameter and 0.5 millimeter wall thickness. The filled tube was drawn in 30 repetitions to a diameter of 2.8 millimeters. The drawn tubing was rolled into 6 millimeter wide tape 0.05 to 0.5 millimeters in thickness. For example, rolling was repeated about 100 times for a tape of 0.01 millimeter thickness. The tape was heat treated at 910° C. for twenty hours to react and sinter the core to form a continuous superconducting core.

It is an object of this invention to provide a method of forming a silver clad tape of the oxide superconductors that does not require extensive drawing and rolling operations.

BRIEF DESCRIPTION OF THE INVENTION

A superconducting tape having a silver sheath and a polycrystalline oxide superconductor core is formed by the method of this invention. The method comprises forming at least one silver foil to have a receiving surface for supporting a deposit, and at least one enclosing surface that can cover the deposit and overlap another portion of the foil so that the surfaces form the sheath. The foil has a first thickness at the receiving surface and a second thickness at the enclosing surface. A precursor deposit of the superconductor is formed on the receiving surface. The enclosing surface is wrapped to cover the deposit and overlap another portion of the foil to form the sheath. The first and second thicknesses being preselected so that the thickness of the overlapping foils is equivalent to the thickness of foil oppositely facing the overlapping foils. The overlapping foils are sealed, and annealed to reactionsinter the sealed deposit and form the tape.

As used herein, the term "precursor deposit," means an unsintered polycrystalline substantially phase pure material, or a mixture of polycrystalline partially reacted material and oxides that can be reacted to form the substantially phase pure material.

The following description of the invention can be understood with greater clarity if reference is made to the following drawings.

DETAILED DESCRIPTION OF THE INVENTION

Figure 1:
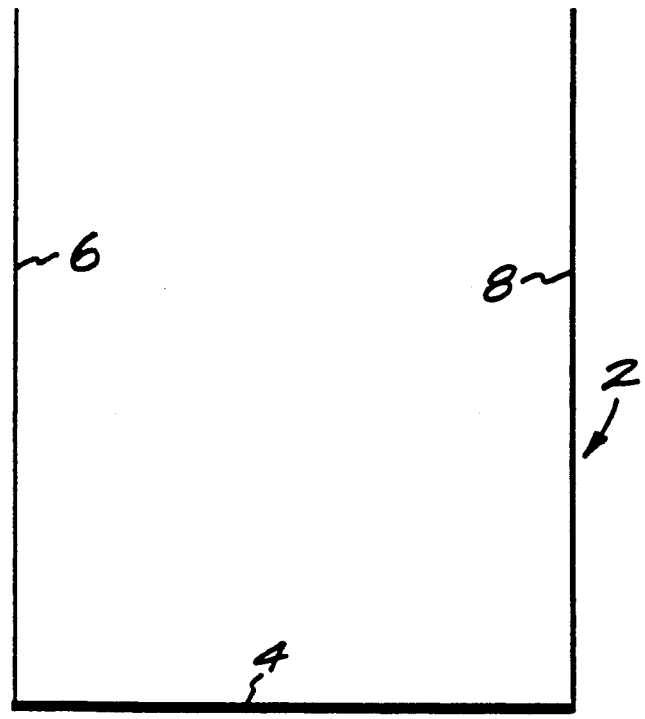
FIG. 1 is a cross-sectional view of a foil formed to receive a deposit.

The known method for forming polycrystalline tape of the oxide superconductors is the powder in tube method discussed above. The powder in tube method requires extensive drawing and rolling steps which inherently introduce process variability and reduced uniformity in the final superconducting tape. In addition, the powder in tube method is limited in the final length of tape or wire that can be formed by the initial length of tubing that is filled with powder and can be drawn and rolled to form the wire or tape. The method of this invention does not require extensive drawing and rolling operations and can be used to form tape of any length desired without limitation from the starting materials.

In the method of this invention, a silver foil is formed into a sheath that surrounds an oxide superconductor core. The silver foil has a thickness suitable for supporting the brittle oxide superconductor core. Preferably, the silver foil has sufficient thickness to provide a current shunt for the superconducting core. For example, the silver foil mechanically supports the relatively brittle oxide superconductor core so that the superconducting tape can be fabricated into a long wire or tape and formed, e.g., as windings in a magnet. A suitable silver foil is at least about 0.025 millimeters in thickness, and preferably is about 0.1 to 0.5 millimeters in thickness.

Several ceramic oxide systems are known to be superconducting. Of particular interest are the alkaline earth cuprate systems containing yttrium, bismuth, or thallium. The yttrium system contains oxides of about 1 gram atom of yttrium or lanthanides, 2 gram atoms of barium, and 3 gram atoms of copper. The bismuth system contains oxides of about 2 gram atoms of bismuth, 2 gram atoms of strontium, 1 or 2 gram atoms of calcium, and 2 or 3 gram atoms of copper. The thallium system contains oxides of about 1 or 2 gram atoms of thallium, 2 gram atoms of barium, 1 or 2 gram atoms of calcium, and 2 or 3 gram atoms of copper.

A precursor powder of the oxide superconductor from the yttrium system, bismuth system, or thallium system can be formed by methods well known in the art. For example, the preparation of superconductors in the bismuth, thallium, or yttrium system can be by solid state reaction of the oxides, or carbonates followed by sintering. Other methods, include coprecipitation from nitrate, acetate, or oxalate solutions and pyrolysis of metal organic precursors. Partial substitution of lead for bismuth in the bismuth system stabilizes the high temperature superconducting phases, and zero resistance above 100 K has been observed in a system with the composition $Bi_{2-x}Pb_xSr_2Ca_2Cu_3O_{10}$, where $0.2 \leq x \leq 0.6$. The precursor powder can also be formed from a partly reacted powder of the desired superconductor. For example, a powder comprised of $Bi_2Sr_2CaCu_2O_{8+y}$ mixed with suitable amounts of PbO, and a pre-reacted mixture of strontium calcium copper oxides can be used. After processing to form the silver sheath around a deposit of the partly reacted powder, the tape can be heated to react the powder to form the superconductor $Bi_{2-x}Pb_xSr_2Ca_2Cu_3O_{10+y}$, where $0.2 \leq x \geq 0.6$.

The precursor powder is poured onto the receiving surface of the formed silver tape to form a precursor deposit. Other techniques well known in the art can also be used to form the precursor powder into a precursor deposit. Tape casting and plastic extrusion can be used to form continuous lengths of the powder. Tape casting and plastic extrusion processes use a mixture of superconductor powder and an organic polymer mixture. The oxide powders are mixed with appropriate amounts of a dispersant, a binder, a plasticizer, and a solvent that is compatible with the other constituents of the mix. The cuprate oxide superconductors react with water and therefore, organic solvents are used. The dispersant is a surface-active agent which limits agglomeration of the powder. The binder gives strength to the green body, and the plasticizer lowers the glasstransition temperature of the binder to impart flexibility to the green body. A suitable organic polymer mixture is comprised of polyvinyl butyral resin as the binder and dispersant, di-isodecyl gluterate as the plasticizer, and methyl isobutyl ketone and toluene as solvents.

A suitable tape-casting mixture contains about 20 to 30 weight percent organics, extrusion mixtures contain less solvent, and hence about 15 to 20 weight percent organics. Tape casting involves spreading the homogeneous mix onto a flat surface. Either a flat parallel surface called a doctor blade or a set of rollers can be used to spread the mixture. Air can be removed from the mixture in a partial vacuum, since entrained air will become voids in the final fired body. In extrusion, the plastic mix is forced under pressure through a die, rather than spread on a surface. Once formed, the green bodies are heated in air or other oxidizing atmosphere to produce monolithic superconductors. Additional powder techniques for forming the precursor deposit include the doctor blade method, spinning, and extrusion, as described for example in, "Potential Methods for the Fabrication of High-TC Superconductors for Wires and Cables," K. Tachikawa, K. Togano, Proceedings of the IEEE, Vol. 77, No. 8, August, 1989, pages 1124–1131, incorporated herein by reference.

An annealing schedule comprises decomposition of organics and reaction-sintering. Organics are burned off below about 300° C., preferably at low heating rates and over a period of hours so that blistering is avoided. Sintering occurs between about 900° and 1000° C. for the yttrium family materials. Annealing in oxygen after sintering is required for the yttrium family materials because of loss of oxygen at sintering temperatures. The bismuth group superconductors are sintered at about 800° to 900° C., and lose very little oxygen at elevated temperatures, therefore, annealing in oxygen may not be required. Additional information about annealing to form the oxide superconductors can be found, for example in, "Processing and Applications of High $T_c$ Superconductors," W. E. Mao, Editor, The Metallurgical Society, PA, 1988, incorporated herein by reference.

Figure 2:
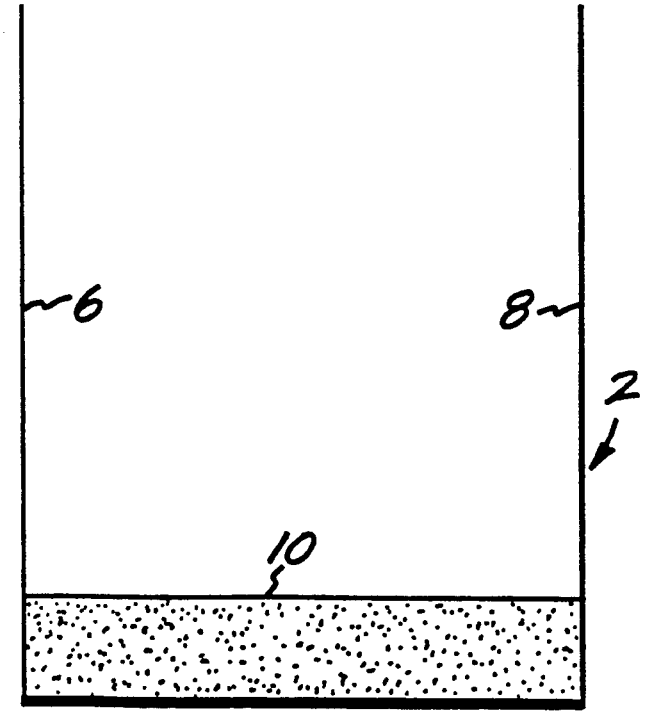
FIG. 2 is a cross-sectional view of the foil in FIG. 1, with a deposit formed thereon.
Figure 3:
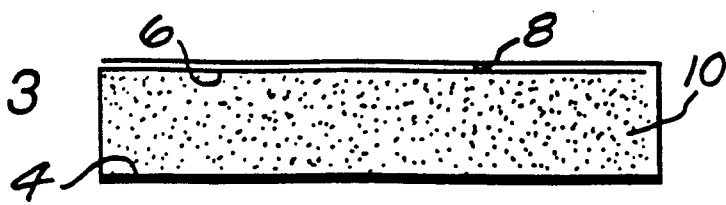
FIG. 3 is a cross-sectional view of the foil in FIG. 2, the foil having been wrapped around the deposit to form a sheath.

The method of this invention is shown by making reference to FIGS. 1-3. First referring to FIG. 1, a silver foil 2, is formed into a channel having a receiving surface 4, and enclosing surfaces 6 and 8. The combined thickness of enclosing surfaces 6 and 8 is equivalent to the thickness of receiving surface 4. For example, silver foil 2 is formed to have a central width portion having a first thickness of the receiving surface 4, and the outer portions of the tape width are half the thickness of receiving surface 4, i.e., enclosing surfaces 6 and 8. Alternatively, foil 2 has a uniform thickness across the width of the foil, and a second foil having the width of the receiving surface 4 and the same thickness as foil 2, is placed on the receiving surface 4 to form twice the thickness of enclosing surfaces 6 and 8.

Referring to FIG. 2, a precursor deposit 10 of the oxide superconductor is formed on receiving surface 4. When deposit 10 is comprised of an organic polymer mix, a decomposition anneal is performed to decompose the polymer mix. Preferably, binders that decompose at temperatures below about 500° C. are used to minimize warping or deformation of foil 2. A suitable decomposition anneal comprises heating in air to about 500° C. at a rate of about 50° C. per hour to minimize blistering in the deposit.

As shown in FIG.3, enclosing surfaces 6 and 8 are wrapped or folded over deposit 10, and enclosing surface 8 overlaps enclosing surface 6. The overlapping enclosing surfaces 6 and 8 are sealed, for example, by light rolling. The tape is reaction sintered by annealing methods well known in the art to form a core of a continuous oxide superconductor in the superconducting tape, and bond the overlapping surfaces 6 and 8 to form a silver sheath sealing the superconducting core therein. For example, a precursor deposit of a yttrium system superconductor can be heated to about 900° to 1000° C., and bismuth or thallium system precursor deposits can be heated to about 800° to 900° C. to reaction sinter the precursor deposit and form the respective superconductors.

Figure 4:
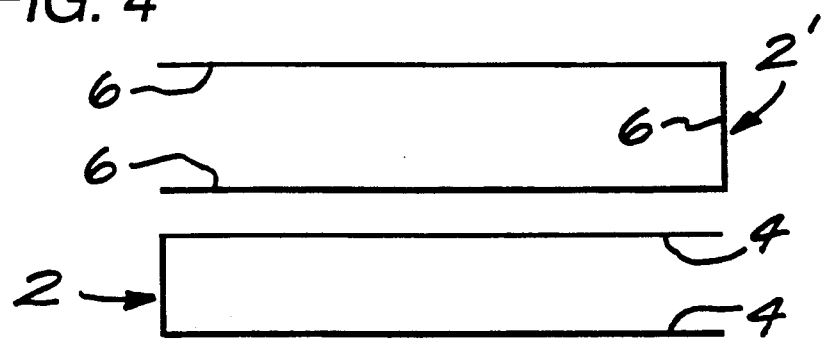
FIG. 4 is a cross-sectional view of two silver foils, a first foil formed to receive a deposit, and a second foil formed to cover the deposit and overlap the first foil to form a sheath for the deposit.
Figure 5:
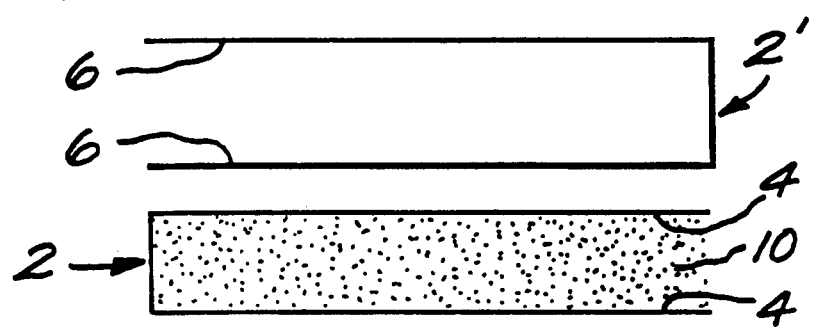
FIG. 5 is a cross-sectional view of the foils in FIG. 4, with a deposit formed in the first foil.
Figure 6:
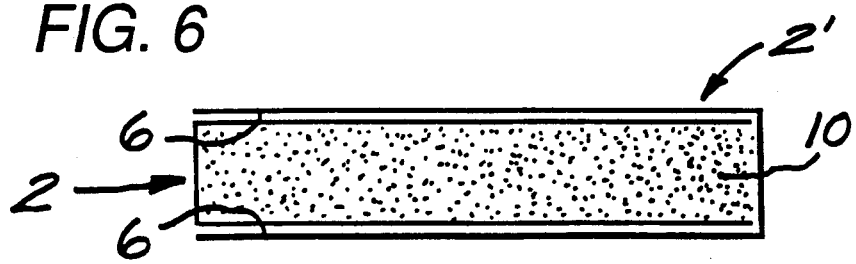
FIG. 6 is a cross-sectional view of the foils in FIG. 5, with the second foil wrapped to cover the deposit and overlap the first foil to form a sheath for the deposit.

Another embodiment of the method of this invention is shown by making reference to FIGS. 4-6. First referring to FIG. 4, a first silver foil 2, is formed into a channel having a receiving surface 4, and a second silver foil 2' is formed into a channel having enclosing surface 6. The thickness of first foil 2 is the same as the thickness of second foil 2'.

Referring to FIG. 5, a deposit 10 of the oxide superconductor is formed on receiving surface 4. When deposit 10 is comprised of an organic polymer mix, a decomposition anneal is performed to decompose the polymer mix as described above.

As shown in FIG. 6, enclosing surface 6 is wrapped over deposit 10 and overlaps first foil 2. The overlapping surfaces of second foil 2' and first foil 2 are sealed, for example, by light rolling. The tape is reaction sintered by annealing methods well known in the art to form a core of a continuous oxide superconductor in the superconducting tape, and bond the overlapping surface 6 with first foil 2 to form a silver sheath sealing the deposit therein.

Additional features and advantages of the method of this invention are shown in the following examples.

EXAMPLE 1

High-purity powders of barium carbonate $BaCO_3$, calcium carbonate, $CaC)_3$, and copper oxide, CuO, were weighed and combined in the ratio of bismuth, lead, strontium, calcium, and copper of about 1.7:0.3:2.05:3.05, respectively. The mixture of oxide and carbonates was calcined at 860° C. for 200 hours in air, with four intermediate ball milling operations. An x-ray determination of the calcined powder showed a ratio of about 93:7 for the 2223:2212 phases respectively. The critical temperature of the superconducting powder was about 107 K as determined by ac susceptibility measurement.

EXAMPLE 2

A moldable ceramic composition was formed by mixing about 195 grams of the superconducting powder formed in Example 1, about 26 grams of ethylene vinyl acetate, about 6.9 grams stearic acid, and about 1.74 grams of Vistonex polyisobutylene. The ceramic molding composition was mixed in a Brabender mixer at 80° C. for about 5 minutes to form a homogeneous mixture. The composition was extruded at 110° C. to form a tape about ¾ of an inch wide by 0.017 to 0.023 inch thick.

Four samples of the extruded tape were cut into strips about 5 inches in length by 2 millimeters wide, and loosely wrapped in silver foil about 0.005 inch thick. The silver foil was formed into a channel and wrapped around the tapes by the method shown in FIGS. 1-3. The loosely wrapped tapes were slowly heated in oxygen to 525° C. in 10 hours, and held at 525° C. for 24 hours to decompose the organics. The decomposed tape was crimped and pressed at about 140,000 psi to about 0.014 inch thickness to seal the foil tape and densify the oxide superconductor core. The pressed tape was fired in air at about 830° C. for 48 hours. Inspection of the tape after firing showed the tape had curled, being concave on the side where the tape overlapped and was sealed. The tape was rolled to a thickness of 0.01 inch, and fired at 830° C. in air for 48 hours. Inspection of the tape showed that it had curled again, being concave on the side where the silver tape was overlapping. The critical current of the sample was measured at 77 K in a 0 Tesla field to be 0.55 amp, and 0.85 amp respectively.

EXAMPLE 3

Two of the tapes formed in Example 2 about 2 millimeters wide by about 6 inches long were partially wrapped in silver foil about 0.005 inch thick as shown in FIG. 4. The partially wrapped tape was heated in oxygen to 525° C. in 10 hours, and held at 525° C. for 24 hours to decompose the binder. After heating it was noticed the tape was cambered so that the tape edge covered with silver was concave.

A second silver foil was wrapped around the tape as shown in FIG. 5 and the tape was straightened to remove the camber. The tape was lightly pressed to 0.04 inch thickness to seal the silver foil. The tape was heated in air to 830° C. for 48 hours, and rolled to a final thickness of 0.01 inch. The tape was measured to have a critical current at 77 K and 0 Tesla field of 1.85 amps, and 2.0 amps respectively.

What is claimed is:

1. A method of forming a superconducting tape having a silver sheath and a polycrystalline oxide superconductor core, comprising:

forming at least one silver foil, having a length and a width dimension, to have a receiving surface extending along the length dimension for supporting a deposit, and at least one enclosing surface that can cover the deposit and overlap another portion of the foil so that the surfaces form the sheath, the foil having a first thickness at the receiving surface and a second thickness at the enclosing surface;

forming a precursor deposit of the superconductor on the receiving surface;

wrapping the enclosing surface to cover the deposit and overlap another portion of the foil to form the sheath, the first and second thicknesses being preselected so that the thickness of the overlapping foils is equivalent to the thickness of foil oppositely facing the overlapping foils;

urging the overlapping foils together to form a seal, and reaction-sintering the precursor deposit to form the superconductor core.

2. The method of claim 1 wherein the deposit is comprised of a binder, further comprising the step of decomposing binder in the tape before the step of wrapping.

3. The method of claim 1 after the step of sealing, further comprising the step of compacting the deposit to align the crystals in the deposit in the length dimension of the tape.